US006875986B1

(12) United States Patent
Murakoshi et al.

(10) Patent No.: US 6,875,986 B1
(45) Date of Patent: Apr. 5, 2005

(54) ION GENERATION METHOD AND FILAMENT FOR ION GENERATION APPARATUS

(75) Inventors: Atsushi Murakoshi, Kawasaki (JP); Kyoichi Suguro, Yokohama (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/559,345

(22) Filed: Apr. 27, 2000

(30) Foreign Application Priority Data

Apr. 28, 1999 (JP) .......................................... 11-121692
Sep. 24, 1999 (JP) .......................................... 11-269854

(51) Int. Cl.$^7$ ................................................ H01J 37/08
(52) U.S. Cl. .................... 250/424; 250/425; 250/423 R
(58) Field of Search ................................ 250/424, 425, 250/423 R

(56) References Cited

U.S. PATENT DOCUMENTS 4,649,059 A * 3/1987 Eden et al. .................. 427/35
6,051,150 A * 4/2000 Miyakawa .................. 216/67

FOREIGN PATENT DOCUMENTS

JP 03-013576 1/1991
JP 10-188833 7/1998

* cited by examiner

*Primary Examiner*—Kiet T. Nguyen
(74) *Attorney, Agent, or Firm*—Finnegan, Henderson, Farabow, Garrett & Dunner, L.L.P.

(57) ABSTRACT

According to the ion generation method, ion source material composed of an element of desired ions to be generated and I is heated so that vapor of the compound is generated, and the ions are generated by discharging the vapor. The iodide has no corrosiveness, and can be stably ionized. Further, it hardly reacts with oxygen or water and is safe.

11 Claims, 5 Drawing Sheets

| OVEN TEMPERATURE | In(113) | In(115) | I(126) | VACUUM IN CHAMBER |
|---|---|---|---|---|
| 200℃ | 0.1μA | 0.4μA | 0.8μA | 4.22e-7torr |
| 225℃ | 0.3μA | 0.4μA | 1.0μA | 4.22e-7torr |
| 250℃ | 0.3μA | 0.4μA | 0.8μA | 4.66e-7torr |
| 275℃ | 2.7μA | 9.6μA | 1.8μA | 4.93e-7torr |
| 300℃ | 3.2μA | 18.3μA | 10.7μA | 5.73e-7torr |
| 310℃ | 15.5μA | 62.2μA | 104.7μA | 6.27e-7torr |
| 320℃ | 26.5μA | 144.7μA | 286.0μA | 7.37e-7torr |
| 330℃ | 104.4μA | 405.7μA | 784.2μA | 7.37e-7torr |
| 340℃ | 1098.9μA | 2411.5μA | 2112.9μA | 9.27e-7torr |
| 350℃ | 1511.0μA | 4740.5μA | 4020.1μA | 9.69e-7torr |
| 360℃ | 1010.4μA | 5500.6μA | 6620.8μA | 1.05e-6torr |
| 370℃ | 955.4μA | 5845.5μA | 5714.3μA | 1.08e-6torr |
| 380℃ | 961.5μA | 6385.8μA | 6245.4μA | 1.12e-6torr |
| *390℃ | 1169.1μA | 19401.6μA | 9056.0μA | 2.86e-6torr |
| *400℃ | ——— | ——— | 11376.0μA | 1.17e-5torr |

FIG. 3

| OVEN TEMPERATURE | In(113) | In(115) | I(126) | VACUUM IN CHAMBER |
|---|---|---|---|---|
| 200℃ | 0.1μA | 0.4μA | 0.8μA | 1.40e-4torr |
| 225℃ | 0.1μA | 0.2μA | 1.0μA | 1.40e-4torr |
| 250℃ | 0.3μA | 0.4μA | 0.7μA | 1.40e-4torr |
| 275℃ | 2.7μA | 9.6μA | 1.8μA | 1.28e-4torr |
| 300℃ | 7.2μA | 23.0μA | 3.2μA | 1.28e-4torr |
| 310℃ | 10.4μA | 36.5μA | 5.0μA | 1.28e-4torr |
| 320℃ | 22.3μA | 80.2μA | 12.6μA | 1.17e-4torr |
| 330℃ | 31.4μA | 103.2μA | 20.7μA | 1.17e-4torr |
| 340℃ | 37.4μA | 160.0μA | 20.7μA | 1.17e-4torr |
| 350℃ | 50.5μA | 170.0μA | 21.4μA | 1.17e-4torr |
| 360℃ | 55.6μA | 171.2μA | 24.7μA | 1.17e-4torr |
| 370℃ | 56.8μA | 210.9μA | 93.5μA | 1.17e-4torr |
| *380℃ | 2.75μA | 879.1μA | 91.9μA | 1.17e-4torr |
| *390℃ | 304.9μA | 1175.2μA | 113.2μA | 1.17e-4torr |
| *400℃ | ——— | ——— | 124.2μA | 1.17e-4torr |

FIG. 4

ION GENERATION METHOD AND FILAMENT FOR ION GENERATION APPARATUS

CROSS-REFERENCE TO RELATED APPLICATIONS

This application is based upon and claims the benefit of priority from the prior Japanese Patent Applications No. 11-121692, filed Apr. 28, 1999; and No. 11-269854, filed Sep. 24, 1999, the entire contents of which are incorporated herein by reference.

BACKGROUND OF THE INVENTION

The present invention relates to an ion generation method and an ion irradiation method, and more particularly, to an ion generation method and an ion irradiation method that are effective for formation of a shallow diffusion layer. The present invention also relates to a filament suitable for an ion generation apparatus.

The ion implantation method (ion irradiation method) is widely employed as a method of forming pn junction by introducing with an impurity such as boron (B), phosphorous (P), arsenic (As), or the like into a semiconductor substrate. In the ion implantation method, an impurity can be introduced into a desired portion by accurately controlling the concentration and the depth of the impurity.

As high integration of the ULSI is promoted and the element size is reduced, the importance in the formation of a shallow pn junction is increased. The above-mentioned ion implantation method is one of the doping techniques employed widely in the semiconductor device manufacturing process, and is employed for the formation of the pn junction by combination with a heat process (annealing) that is conventionally executed after the ion implantation.

However, formation of a shallow pn junction using B as the p-type dopant includes many difficult points as explained below. First, B, which is a light element, brings about the remarkable channeling tale at the time of ion implantation. For this reason, lowering the energy of the accelerated voltage for shallow introduction of B causes lowering of the effective dose due to the influence from reflection, spattering and the like. Otherwise, ions cannot be extracted when the voltage is too low in accordance with the apparatus performance. Further, B has a large diffusivity in silicon, and therefore, it brings about, for example, the short channel effect of a pMOS transistor.

Thus, a process using a heavy element such as gallium (Ga) and indium (In), which is also a p-type dopant similarly to B, is noticed. In an ion irradiation apparatus (an ion generation apparatus) executing the above-mentioned ion implantation method (ion irradiation method), generally, gas is introduced into an arc chamber, or either a solid or a liquid is sublimated and its vapor is introduced into an arc chamber, to execute the ionization of In.

In the case of the In ion implantation, a chloride ($InCl_3$) is known as a solid source. The present inventor found the following problem in the p-type dopant ion implantation methods using the solid of this kind. That is, in the case of a chloride, chlorine corrodes metal members of the apparatus.

Particularly, the etching reaction is strong in the arc chamber and the ion source chamber, and therefore, a filament for emitting thermoelectrons is corroded. For this reason, the ionization of In cannot be stably executed and a long-time work is extremely difficult. Specifically, the work can be executed in an only short time ranging one to four hours and the use of the chloride is not practical.

On the other hand, an organic gas source such as trimethyl indium (TMI), triethyl indium (TEI) is known as a gas source. TMI, which has a vapor pressure at a normal temperature, is ionized in a support gas such as Ar, for example, and an In ion beam is extracted therefrom.

However, the present inventor also found the following problem in the p-type dopant ion implantation method using an organic gas source of this kind. An organic gas drastically reacts with oxygen or water and is therefore very dangerous. Even in a vacuum apparatus the organic gas source is too dangerous as an ion source of the ion irradiation apparatus, when the suction of atmosphere caused by vacuum leak and the like, filling of TMI/TEI, the ion source maintenance after use of TMI/TEI, and the like are considered.

Incidentally, the ion source chamber serving as a heart of the ion implantation apparatus (ion irradiation apparatus) is largely classified into the Freeman type using a hot electrode, the Bernas type and the microwave type using magnetron.

Next, a method of extracting ions by taking advantage of the hot electrode with this apparatus will be explained simply. Ar gas and ion source gas or vapor are, for example, supplied through a gas inlet port of the ion source chamber (arc chamber) and thermoelectrons are emitted from the tungsten filament in the chamber. Further, the direction of movement of the emitted thermoelectrons is deflected, and therefore, the probability of collision of the Ar gas and the ion source gas or vapor introduced into the chamber to the thermoelectrons can be increased.

In these conventional ion source chambers, the source of the ions to be irradiated is generally introduced into the arc chamber as gas, or vapor obtained by sublimating the solid as mentioned above. Discharging is made to occur between the filament and an electrode which is opposite thereto, and the thermoelectrons emitted from the filament collide with the gas or vapor to make it ionized, and the ions to be irradiated are obtained and extracted from the chamber.

To achieve the above object, it is necessary to apply the high electric field to the filament and efficiently emit the thermoelectrons. For this reason, tungsten that is a refractory metal is generally used as the material of the filament. In the case of pure tungsten, however, if discharging continues, the temperature of the filament almost rises up to the melting point, and tungsten may be crystallized when the temperature drops after stop of discharging. In a next discharging, the temperature of the crystalline grain boundary rises up locally and therefore the filament is broken.

For this reason, adding a trace amount of metals such as Al, Si, K and the like to pure tungsten and raising the recrystallization temperature of tungsten to improve its strength at a high temperature has been conventionally executed.

Such a melting point raising technique of adding a trace amount of impurities to the tungsten filament is also used for a filament of a fluorescent lamp or the like. In the case of the filament for the ion generation apparatus chamber, however, the filament is in direct contact with the specific material gas that is introduced into the chamber as the ion source. Many specific material gases generally have corrosiveness and reactivity. Therefore, the environment of use of the filament for the ion generation apparatus chamber is more severe than that of the filament of the fluorescent lamp used generally in an inert gas atmosphere. For this reason, there is a problem that the lifetime of the filament for the ion generation apparatus chamber is short.

Further, when a partial pressure of desired gas is low, it is necessary to increase the filament current to obtain a desired ion current. However, even if a trace amount of metals such as Al, Si, K and the like are added to raise the recrystallization temperature of tungsten, inconvenience such as the breakage of the filament occurs as a consequence of the recrystallization of tungsten.

Even when the filament is not broken, the impurities segregate the recrytalline grain boundary, which prevents the thermoelectrons from being emitted from the filament.

BRIEF SUMMARY OF THE INVENTION

The first object of the present invention is to provide an ion generation method and an ion irradiation method that can execute the ionization of In stably and safely.

The second object of the present invention is to provide a filament which has a long life and allows flow of a high filament current and which can reduce variation in the filament current, and also provide an ion generation apparatus using the filament.

To achieve the above objects, the ion generation method according to a first aspect of the present invention comprises the steps of: heating an ion source material composed of a compound of an element of desired ions to be generated and I, to generate vapor of the compound; and generating the ions by discharging the vapor.

The ion irradiation method according to a second aspect of the present invention comprises the steps of: generating desired ions and I ions in the ion generation method above-described; and selectively irradiating the desired ions onto a substrate to be processed.

The first and second aspects are preferably executed as mentioned below.

The above desired ions are the ions of at least one element selected from the group consisting of B, Al, Ga, In, Ti, N, P, As, Sb and Bi.

The above compound is InI.

The step of heating an ion source material comprises a step of heating the InI at a temperature of not lower than 250° C. and not higher than 380° C., to generate vapor of the InI.

According to the study of the prevent inventor, it is understood that the iodide containing the element of ions which should be generated has no corrosiveness and are stably ionized. It is further understood that the iodide of this kind hardly reacts with oxygen or water and is therefore safe. For this reason, if the iodide containing the element of the ions to be generated is used as the ion source material, the ion generation method and the ion irradiation method that allow the ionization of this element to be executed stably and safely can be implemented as described in the present invention.

The filament according to the third aspect of the present invention comprises: a refractory metal; and at least one of rare earth elements and rare earth metal oxides contained in the refractory metal.

The ion generation apparatus according to the fourth aspect of the present invention comprises: a chamber formed in a shape of a casing; a gas introduction section for introducing gas to generate plasma into the chamber; the filament above-described, arranged in the chamber; a plasma generation section for generating desired ions by generating the plasma of the gas with thermoelectrons emitted from the filament; and an ion outputting section for outputting the ions generated in the chamber outside the chamber.

The ion irradiation apparatus according to the the fifth aspect of the present invention comprises: an ion generation apparatus above-described; and an irradiation chamber which is provided outside the ion generation apparatus and in which ions discharged through an opening portion formed on the ion generation apparatus are irradiated onto a substrate to be processed.

The third to fifth aspects are preferably executed as described below.

The refractory metal is W and at least one of the rare earth elements and the rare earth metal oxides is selected from the group consisting of Re, La, Ce, Y, Re oxides, La oxides, Ce oxides and Y oxides.

The refractory metal is W, at least one of the rare earth elements and the rare earth metal oxides is Re, and the Re is contained in the w at 1% or more and 26% or less.

The refractory metal is W, at least one of the rare earth elements and the rare earth metal oxides is an oxide selected from the group consisting of La oxides, Ce oxides, Re oxides and Y oxides, and a content of the oxide contained in the filament is 5% or less.

In the present invention, thermoelectrons can be stably emitted for a long time and the stable ionization can be implemented without lowering the ion beam current, by using the tungsten filament containing the rare earth oxide. Therefore, a large advantage can be achieved by applying the present invention to, for example, an ion implantation step in the production of a semiconductor apparatus.

In addition, in the present invention, the recrystallization temperature can be made higher, embrittlement caused together with the recrystallization can be restricted and ductility can be kept by using the tungsten filament containing Re. Therefore, the ionization can be stably executed.

Further, the electric resistivity of the filament can be made larger in the present invention. To obtain a predetermined resistance, the diameter of the filament can be made larger than that of the conventional filament. Thus, the strength of the filament cannot only be increased, but also the amount of the emitted thermoelectrons can be remarkably increased. Therefore, as the present invention can contribute to the increase in the amount of beam current, for example, at the time of the lower energy ion implantation, the implantation time can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a table showing the relationship between the InI heating temperature and an amount of the ion beam current, FIG. 4 is a table showing the relationship between the $InI_3$ heating temperature and the amount of ion beam current;

DETAILED DESCRIPTION OF THE INVENTION

Figure 1:
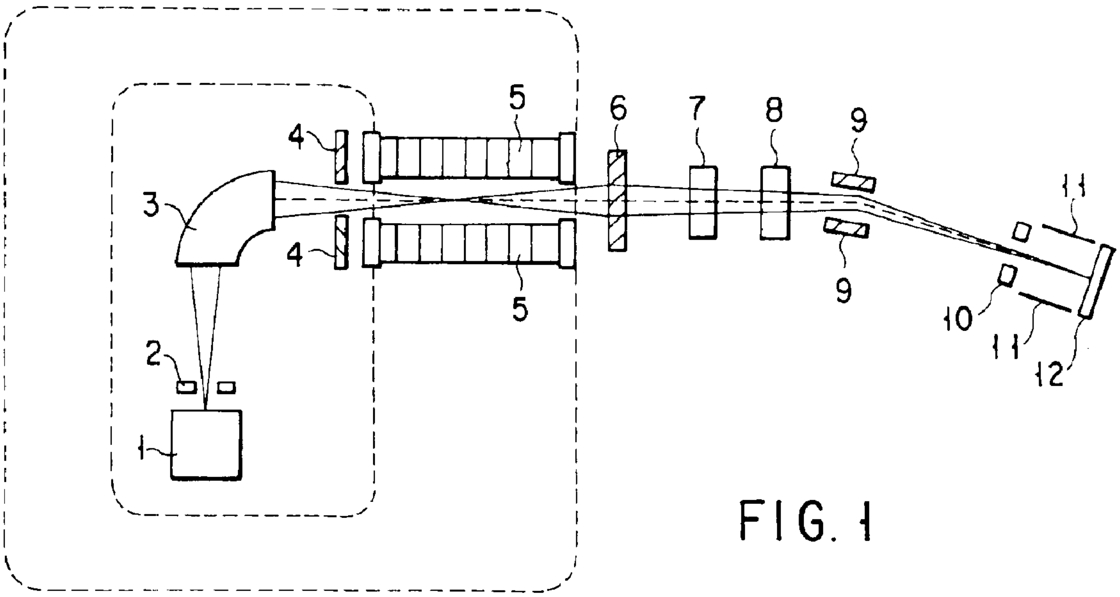
FIG. 1 is a pictorial diagram showing an ion irradiation apparatus used to execute an ion irradiation method according to a first embodiment of the present invention.

Embodiments of the present invention will be explained below with reference to the drawings.

(First Embodiment)

First, a summary of the ion irradiation apparatus of the present invention will be explained with reference to FIG. 1. The present invention is remarkably characterized by a substance (an ion source material) which is introduced into an ion source chamber that serves as an ion generation apparatus as described later. The structure of the ion generation apparatus of the present invention is the same as the structure of a conventional ion irradiation apparatus except for details of the ion source chamber.

In the ion irradiation apparatus, first, ions are generated in an ion source chamber 1 (details will be described later). The ions are extracted by an extraction electrode 2 and separated by an analyzing magnet 3 in accordance with their mass.

Next, desired ions separated completely by a slit 4 are accelerated or decelerated to target energy by an accelerator 5. After that, the ion beam is focused to have a focus on a surface of a processed substrate 12 (for example, a semiconductor substrate) by a quad-pole lens 6.

Next, scanning electrodes 7 and 8 scan an entire sample surface for the dose to be uniformly distributed thereon. To remove neutron particles generated in collision with the residual gas, the ion beam is deflected by a deflection electrode 9 and then irradiated onto the surface of the processed substrate 12 through a mask 10. A shielding plate 11 is connected to the earth.

Figure 2A:
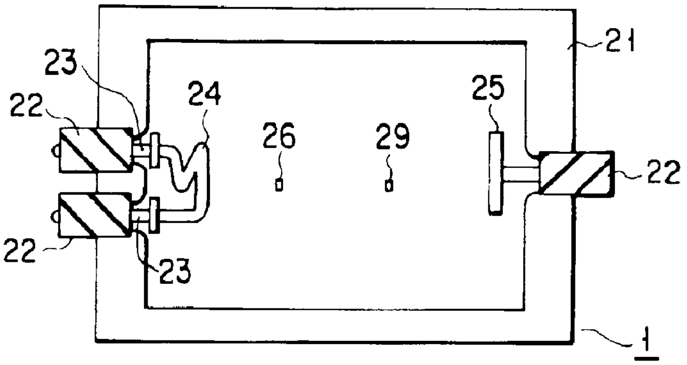
FIG. 2A is a sectional view showing an ion source chamber 1 in the ion irradiation apparatus of FIG. 1 as seen along a surface parallel to an upper surface thereof.
Figure 2B:
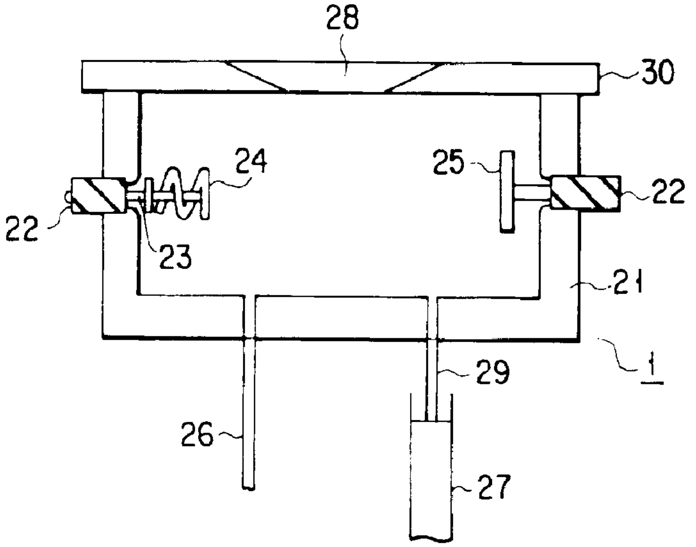
FIG. 2B is a sectional view showing the ion source chamber 1 in the ion irradiation apparatus of FIG. 1 as seen along a surface parallel to a front surface thereof.

FIGS. 2A and 2B show a sectional structure of the ion source chamber 1 in the ion irradiation apparatus of FIG. 1. The figures show a Bernas-type ion source chamber, but it may be a Freeman-type ion source chamber. FIG. 2A shows a section parallel to the upper surface of the ion source chamber and FIG. 2B shows a section parallel to the front surface thereof.

On one side surface of an arc chamber 21 structured with materials including tungsten as its major component, a tungsten filament 24 is provided at a reflector 23 (a spacer) containing tungsten as its major component that is held via an insulation support portion 22. On the other side surface of the arc chamber 23, a counter electrode 25 containing tungsten as its major component is provided while being held via an insulation support portion 22.

Ar gas is, for example, supplied through a first gas inlet 26. At the same time, InI (indium iodide) having a particle size ranging from 2 to 5 mm supplied into an oven 27 is heated and InI vapor is generated. The vapor discharged from the oven 27 is introduced into the arc chamber 21 through a second gas inlet (an oven nozzle) 29. The InI vapor supplied into the arc chamber 21 is ionized, and the ions are extracted through an ion extraction opening 28 provided on a front plate 30.

At this time, it is preferable that the particle size of the InI supplied in the oven 27 is larger than the diameter (1 mm in the present embodiment) of the second gas inlet 29 communicating with the arc chamber 21. If the particle size of InI is smaller than the diameter of the second gas inlet 29, when the arc chamber is made vacuum, the particles of InI fly from the oven 27 into the arc chamber 27, which makes stable ionization difficult. Therefore, it is important that the particle size of InI supplied to the oven 27 should be larger than the diameter of the oven nozzle 29.

FIG. 3 shows the relationship between the heating temperature (oven temperature) of InI supplied to the oven 27 and an amount of the ion beam current in the FIGS. 2A and 2B.

There are isotopes of In having the mass number 113 and the mass number 115. FIG. 3 shows the above-mentioned relationship in relation to both isotopes having the mass number 113 and the mass number 115. As for the ionization of InI, this table shows the amount of the ion beam current in a case where the arc voltage is fixed at 90V, the arc current at 2A, the source magnet current at 40A, the extraction voltage at −2.13 kV, and the acceleration energy at 30 keV. That is, it is noted that this value is not the maximum amount of the beam current. The ion beam is extracted under the condition that the applied voltage to the extraction electrode 2 in FIG. 1 is 30 keV.

The initial temperature of the oven 27 is set at 200° C. It is understood from FIG. 3 that the ion beam of In (indium) or I (iodine) cannot be obtained at this temperature and the vapor of InI is not generated.

It is also understood from FIG. 3 that the amount of ion beam current cannot be substantially obtained when the heating temperature of the oven 27 is equal to or lower than at 250° C. and that the amount of ion beam current is increased when the temperature is near 300° C.

When the ion dose is low, i.e. equal to or smaller than $1\times10^{13}$ $cm^{-3}$, it is necessary to improve the in-surface uniformity of the dose and the accuracy in the absolute value by lowering the ion beam current. To satisfy this, the ion beam current needs to be equal to or lower than 10 $\mu$A. When the ion beam current is equal to or higher than 10 $\mu$A, the implantation is executed too quickly.

However, if the ion beam current is set to be equal to or lower than 10 $\mu$A, its stability becomes worse. To obtain the ion beam current equal to or lower than 10 $\mu$A, the arc voltage or current needs to be lowered. Even when the temperature is 250° C., the stable ion beam current suitable for low dose can be obtained by controlling such an arc discharging current.

It is also understood from FIG. 3 that when the temperature exceeds 380° C., the ion beam is extremely unstable though the ion beam current is obtained.

The state of InI remaining in the oven 27 after cooling the oven 27 was observed under the condition that the oven temperature was equal to or higher than 380° C., and it was confirmed that InI having the particle size ranging from 2 to 5 mm had been completely dissolved.

This teaches that when the oven temperature was equal to or higher than 380° C., InI in the oven 27 was boiled and therefore stable vapor could not be obtained. That is, to obtain the stable In ion beam, InI needs to be kept in a particular state. It is optimum to obtain InI vapor by controlling the oven temperature preferably in a range from equal to or higher than 250° C. to equal to or lower than 380° C.

In FIG. 3, the ion beam current value is increased as the oven temperature becomes higher in a range from 275° C. to 380° C., but the changes are not seen in the range of the oven temperature from 350° C. to 380° C. It can be therefore understood that InI is ionized most stably in the range of the oven temperature from 350° C. to 380° C.

Thus, when the maximum amount of the beam current was examined by fixing the oven temperature at 350° C., the amount of the ion beam current was obtained at about 12 mA. The ionization was executed for ten hours and the variation in the amount of the ion beam was examined while setting the oven temperature at 350° C. The stability in the amount of the ion beam current of about 10 mA, which are 80% of the maximum beam current, was examined. As a result, it was confirmed that the variation in the ion beam was in a range of ±5%, i.e. extremely stable ionization of InI was executed.

As a comparative example, the oven 27 of FIGS. 2A and 2B was filled with $InCl_3$ (indium chloride) that had been conventionally used in general and the ionization was executed at 350° C. The beam current obtained at this time was about 16 mA, which is higher than the beam current obtained by using InI (indium iodide).

However, when ionization was executed for ten hours by using about 12 mA, which are 80% of the maximum amount of the beam current, the ionization became unstable after four hours had passed, and the ionization became impossible in about six hours.

When the interior of the arc chamber 21 was examined, the surface roughness occurred on the tungsten arc chamber 21 by the etching redaction and a large amount of reactive products were confirmed in the arc chamber 21. It was also confirmed that the tungsten filament was terribly exhausted, the reactive products were applied to parts that should have been originally insulated, and a short circuit was caused. This indicates that chlorine ions and radical tungsten generated together with ionization of $InCl_3$ made drastic reaction with the above-mentioned parts and stable ionization was difficult for a long time.

However, the ion source chamber 1 does not corrode and the ionization can be stably executed by using In as disclosed in the present embodiment. Iodine is stable to water or oxygen and has no corrosiveness as seen in chlorides. Unlike trimethyl indium (TMI) and triethyl indium (TEI), iodine has no danger of explosively making burning reaction with water or oxygen, and it can be said to be a suitable material as the ion source material in terms of the safety.

The oven 27 is formed of an alloy including Fe (iron). When $InCl_3$ is used, the interior of the oven 27 corrodes by chloric vapor and $Fe^+$ having the same mass numbers (112 and 113) as $In^{2+}$ is generated. $In^{2+}$ and $Fe^+$ cannot be separated by the analyzing magnet 3, and therefore, $Fe^+$ is also implanted to the sample. As a result, the problems that the dose is varied and the leak current is increased occur.

If InI is used, however, ions etching the oven 27 are not generated, and therefore, the problem such as the variation in the dose or increase in the leak current does not occur.

FIG. 4 shows the relationship between the heating temperature (oven temperature) of $InI_3$ supplied into the oven 27 in FIGS. 2A and 2B, and the amount of the ion beam current.

As for $InI_3$ (indium triiodide), desorption of I is radical and ionization of In is more difficult as compared to InI. The melting point of $InI_3$ is lower than that of InI, i.e. about 210° C. However, if it is heated at 200° C., it is divided into I and InI and thereby the vapor can be obtained.

At this time, a great amount of I is generated. Therefore, the degree of vacuum in the ion source chamber 1 is lowered, an optimum discharge voltage cannot be obtained with the result that ionization becomes difficult, and the amount of the In ion beam current is remarkably reduced.

Therefore, when $InI_3$ is used as the In ion source, it is preferable to temporarily heat $InI_3$, cool $InI_3$ after desorbing I, heat again InI remaining in the oven 27 (note: I has higher vapor pressure and therefore InI is left more easily) and execute the ionization. However, desorption of I requires a long time, and the productivity becomes very worse by using $InI_3$.

The present invention is not limited to the above-described embodiment. In the embodiment, for example, a case where the iodide is InI has been explained. However, the iodides of III-group elements (n-type dopants) such as B, Al, Ga and Ti can be used. Specifically, as for Ga, $GaI_3$ (having the melting point of 222° C.) and GaI can be cited.

The ion implantation of the p-type dopants has been explained, but the present invention can be also applied to the ion implantation of n-type dopants. In this case, for example, iodides of V-group elements such as N, P, As, Sb and Bi are used. In the case of the ion implantation of As and P, solid As and solid P may be used. Further, the iodides of two or more elements selected from those elements may also be used.

The ion implantation of the p-type dopants and that of the n-type dopants are different with respect to the only ion source materials, and they can be executed by the same apparatus. Further, a conventional apparatus can be used and an exclusive apparatus does not need to be produced, and therefore, the producing costs for this are not generated.

A specific semiconductor process using the ion irradiation apparatus has not been explained in the above embodiment. However, the present invention can be applied to, for example, the DRAM process of 256 or more MBit, i.e. the ion implantation process for forming a source diffusion layer and a drain diffusion layer of a MOS transistor for a memory cell. The present invention can also be applied to the ion beam mixing.

In the embodiment, the arc chamber 21 is formed of tungsten as its major component. However, it may be formed of the other metal as its major component, but it is preferable not to use a metal making reaction with I, for example, Al.

Next, the filament suitable for the ion generation apparatus, and the ion generation apparatus using this filament will be explained as second and third embodiments.

(Second Embodiment)

The Bernas-type ion irradiation apparatus constituted as shown in FIG. 1 is also used in the second embodiment, but the ion source chamber 1 is different from that of the first embodiment.

Figure 5A:
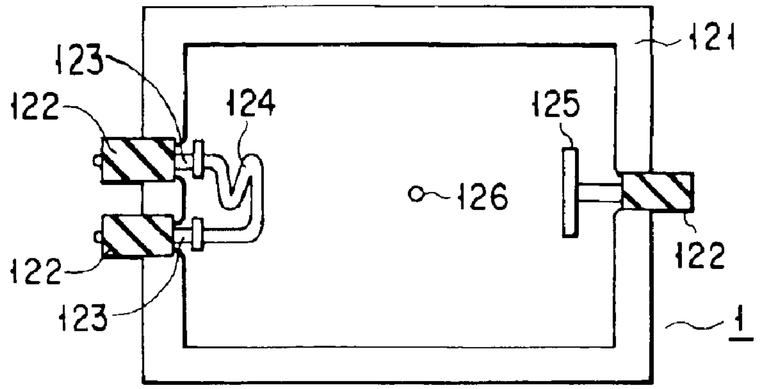
FIG. 5A is a sectional view showing a Bernas-type ion source chamber according to a second embodiment of the present invention as seen along a surface parallel to an upper surface thereof.
Figure 5B:
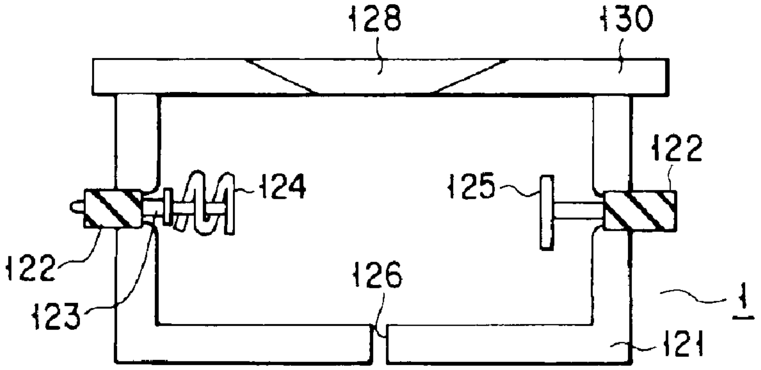
FIG. 5B is a sectional view showing the Bernas-type ion source chamber according to the second embodiment of the present invention as seen along a surface parallel to a front surface thereof.

FIGS. 5A and 5B show the sectional structure of the Bernas-type ion source chamber according to the present invention. That is, FIG. 5A shows a section parallel to the upper surface of the chamber, and FIG. 5B shows a section parallel to the front surface of the chamber. A tungsten filament 124 is provided at reflectors (spacers) 123 held via insulation support members 122, on one side surface of an arc chamber 121. A counter electrode 125 is provided via the insulation support member 122, at the other side surface of the arc chamber 121.

Next, a method of extracting (or outputting) the ions by using this apparatus will be explained. For example, Ar gas is supplied through a gas inlet opening 126, the thermoelectrons are discharged from the tungsten filament 124, and the direction of movement of the thermoelectrons is deflected to a direction opposite to the direction of discharging them from the filament by the counter electrode 125, so as to improve the possibility of collision between the Ar gas introduced into the arc chamber 121 and the thermoelectrons and execute the ionization. The ions are extracted through an ion extraction opening 128 provided at a front plate 130.

Figure 6A:
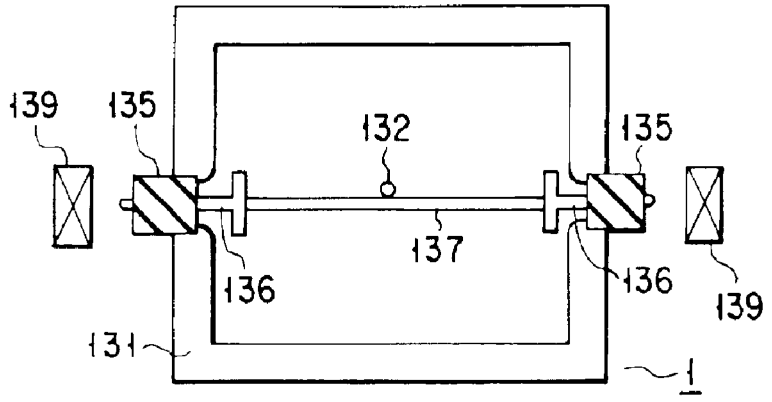
FIG. 6A is a sectional view showing a Freeman-type ion source chamber according to a second embodiment of the present invention as seen along a surface parallel to an upper surface thereof.
Figure 6B:
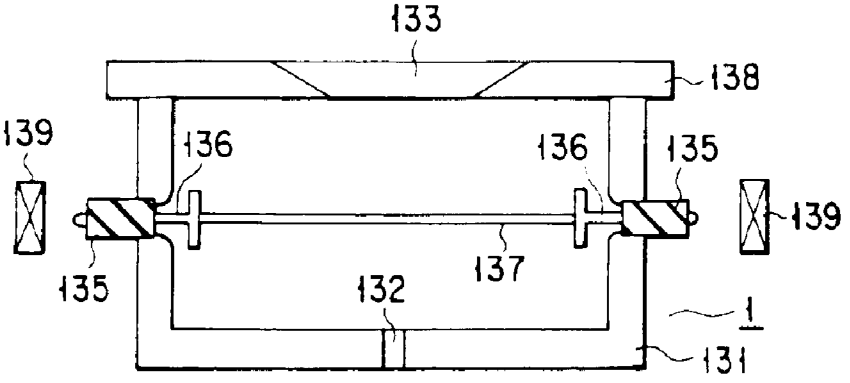
FIG. 6B is a sectional view showing the Freeman-type ion source chamber according to the second embodiment of the present invention as seen along a surface parallel to a front surface thereof.

On the other hand, FIGS. 6A and 6B show the sectional structure of the Freeman-type ion source chamber according to the present invention. That is, FIG. 6A shows a section parallel to the upper surface of the chamber and FIG. 6B shows a section parallel to the front surface of the chamber. Reflectors 136 are provided at opposing surfaces of an arc chamber 131 via insulation support members 135, respectively. A rod-shaped tungsten filament 137 is provided between the opposing reflectors 136.

Next, a method of extracting the ions by using this apparatus will be explained. For example, Ar gas is supplied through a gas inlet opening 132, and the thermoelectrons are discharged from the tungsten filament 124 to generate the plasma. At the same time, a magnetic field parallel to the filament 137 and a rotating magnetic field of a filament current are generated by electromagnets 139, and the electrons are complicatedly moved in the arc chamber 131 by the effect of the reflectors 136. Thus, the possibility of collision between the thermoelectrons discharged from the tungsten filament 137 and the gas supplied through the gas inlet opening 132 can be improved. The ions are extracted through an ion outlet opening 133 provided on the front plate.

The present invention mainly relates to a tungsten filament and a tungsten member used as an ion source, and can be applied to both the above-described Bernas-type ion source chamber and Freeman-type ion source chamber. In the following explanation, the Bernas-type ion source chamber shown in FIGS. 5A and 5B will be exemplified while compared with a filament using conventional doped tungsten.

In the ion generation apparatus of the second embodiment, for example, a product obtained by processing tungsten containing 3% of Re is used. The tungsten filament 124 containing 3% of Re is provided via the reflectors (spacers) 123 that are constituted by tungsten containing 3% of Re similarly to the arc chamber 121, on one side surface of the arc chamber 121. The counter electrode 125 constituted by tungsten containing 3% of Re similarly to the chamber is provided, via the insulation support member 122, on the other side surface of the arc chamber 121. $BF_3$ gas is for example supplied through the gas inlet opening 126 and the ions are extracted through the ion extraction opening 128 provided on the front plate.

In the second embodiment, tungsten containing 3% of Re is also used for the front plate 130 having the ion extraction opening 128. That is, Re is added to all the members formed of tungsten. When $BF_3$ gas is supplied through the gas inlet opening 126 and the thermoelectrons are discharged from the filament 124, $BF_3$ gas is ionized by the discharging. The generated B ions, F ions, $BF_2$ ions, and the like are extracted through the extraction opening 128, but after that only B ions are extracted by the analyzing magnet and the ions are irradiated onto the sample.

In this case, the beam current of about 10 mA is obtained with the acceleration voltage of 35 kev. Stable discharging can be obtained at the beam regulation of about ±5%, regardless of the length of the discharging time, up to sixty hours, and the discharging can be kept for up to about eighty hours.

On the other hand, when $BF_3$ gas is introduced into the conventional ion source chamber formed of the doped tungsten (note: tungsten containing impurities such as Al, Si, K and the like is called doped tungsten) to which a trace amount of Al, Si and K is added, so as to execute the ionization, the beam current of 8 mA can be also obtained, but the amount of the beam current is inclined to be reduced along with the discharging time. After the discharging has been executed for ten hours, the amount of the beam current is reduced at about 20% as compared with the initial amount. The discharging becomes unstable in about fifty hours, which makes the ionization difficult.

The above phenomenon is considered to occur for the following reason. As for conventionally used pure tungsten and doped tungsten containing a trace amount of Al, Si and K, their strength is kept by formation of coarse recrystallization grains (i.e. crystal grains that become coarse because of recrystallization of tungsten) and diffusion of the residual doping agents (impurities such as Al, Si, K and the like). However, long-time use at a high temperature causes the doping agents to make reaction with tungsten and to be deposited on the filament surface, and therefore, the diffusion effect is reduced and the discharging of the thermoelectrons is prevented. In addition, the strength of the filament is deteriorated, the filament is erased by the collision of ions to the filament, and stable ionization cannot be therefore executed.

On the other hand, if Re is added at 3% to pure tungsten and doped tungsten containing a trace amount of Al, Si and K, their strength at a high temperature is increased and recrystallization temperature becomes higher. For this reason, the variation in crystal caused by the use for a long time at a higher temperature can be restricted and the ion beam can be stably obtained for a long time.

Figure 7:
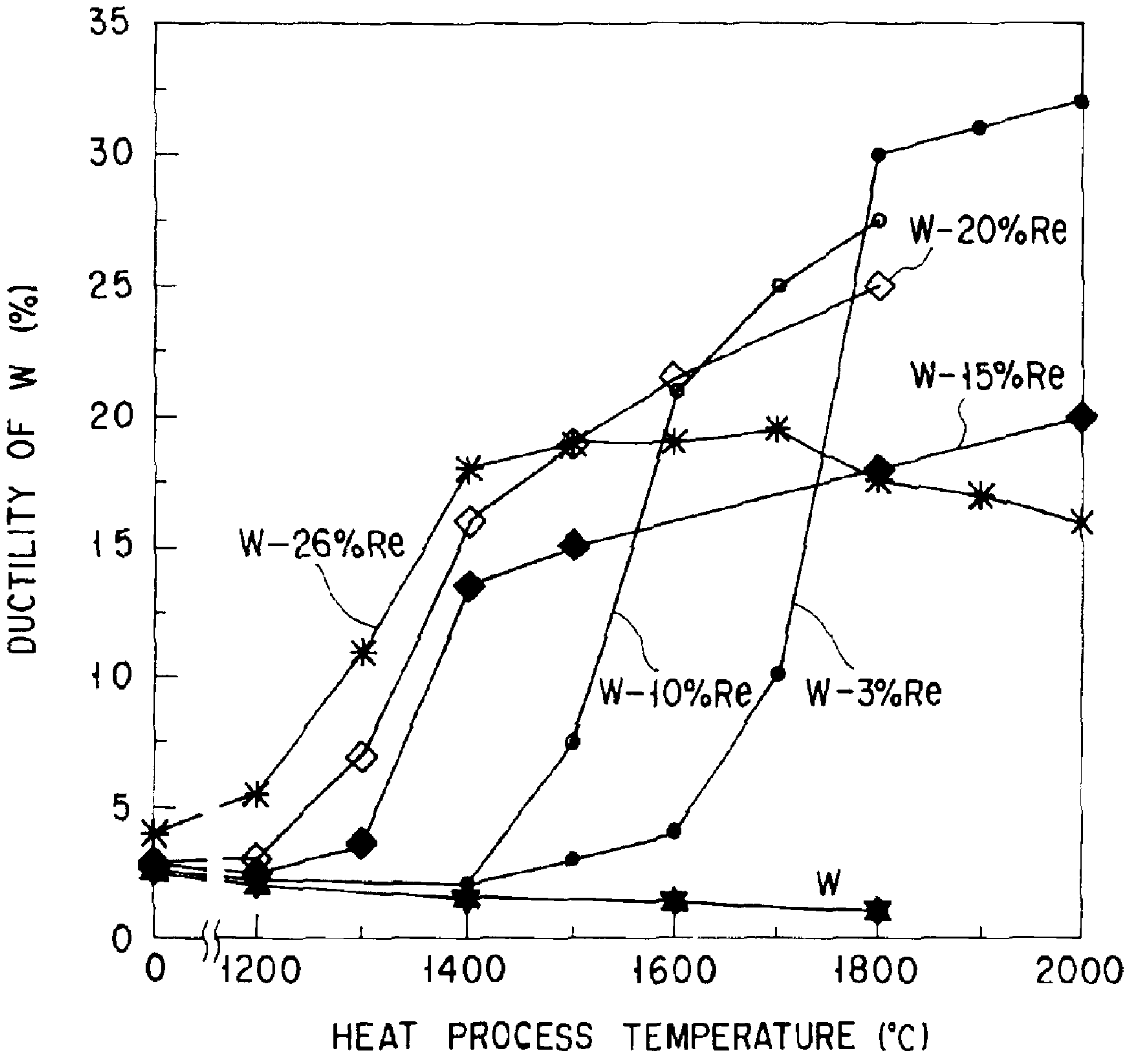
FIG. 7 is a graph showing the relationship between the ductility of tungsten and the heat process temperature.

FIG. 7 shows the variation in the ductility at a room temperature, of the conventional doped tungsten filament and a tungsten filament containing 3% to 26% of Re, after heating them for thirty minutes. In this figure, for example, "W-26% Re" indicates that W indicates 26 wt. % of Re. "W" represents general doped tungsten.

It can be understood that as for the general doped tungsten, its ductility at a room temperature is reduced as the heat treatment temperature becomes higher. This teaches that the ductility is reduced by recrystallization of tungsten, i.e. that the embrittlement caused by recrystallization occurs and, in this case, the filament can be easily broken by the impulse of vibration and the ion spattering effect generated together with the ionization.

On the other hand, in the case of the tungsten filament containing Re, its ductility is increased as the heat treatment temperature becomes higher, and the recovery in the ductility is shifted to the lower temperature side as the content of Re becomes higher. This also corresponds to the variation in the recrystallization temperature of tungsten.

It is presumed from FIG. 7 that it is effective to mainly use a filament containing 3 to 10% of Re at the temperature equal to or higher than 1800° C. and a filament containing Re of 15 to 26% at the temperature ranging from 1200° C. to 1800° C. It can be said that at any of the temperatures, use of the tungsten filament containing Re is better than use of the conventional doped tungsten filament.

Figure 8:
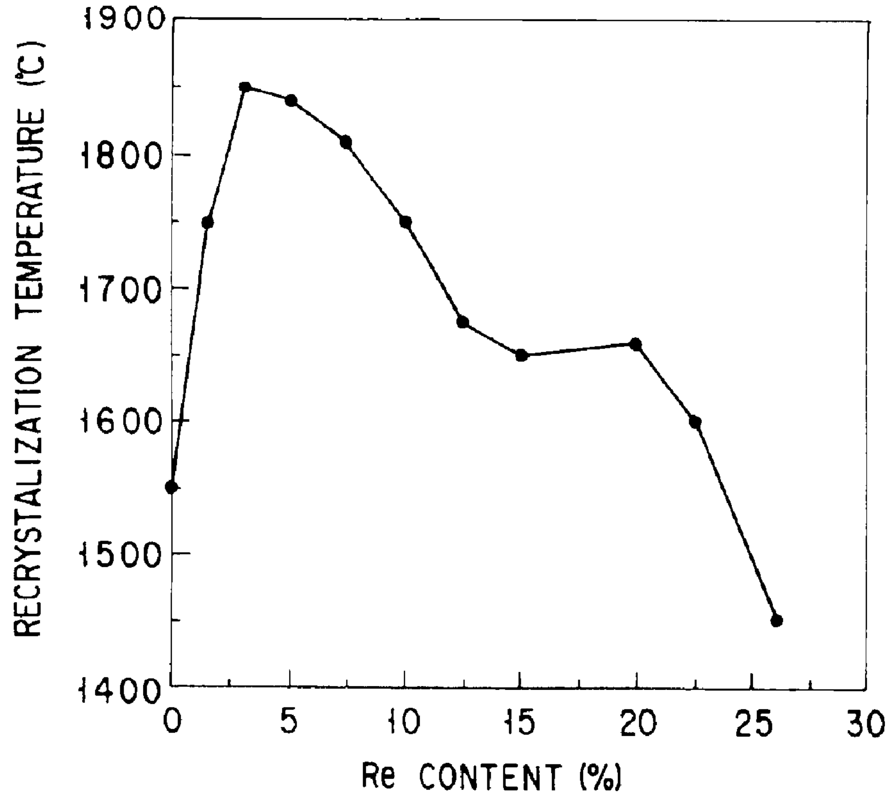
FIG. 8 is a graph showing the relationship between the content of Re and the recrystallization temperature.

FIG. 8 shows the relationship between the content of Re and the recrystallization of tungsten. The figure teaches the inclination that the recrystallization temperature of pure tungsten is about 1500° C., while the temperature radically rises over 1800° C. by addition of 3% of Re and gradually lowers by addition of more amount of Re.

Thus, the recrystallization temperature rises more than that of pure tungsten by addition of Re. However, the recrystallization lowers as the Re content is increased, and therefore, the embrittlement of recrystallization is considered.

In fact, however, the ductility is high in the case of addition of a large amount of Re. This teaches the effect that Re becomes solid-solution and restricts the embrittlement of the crystal grain surface.

Incidentally, only the increase in the recrystallization temperature and the increase in the strength caused by addition of Re cannot be said as the reasons why the beam current of B is increased by addition of Re.

Figure 9:
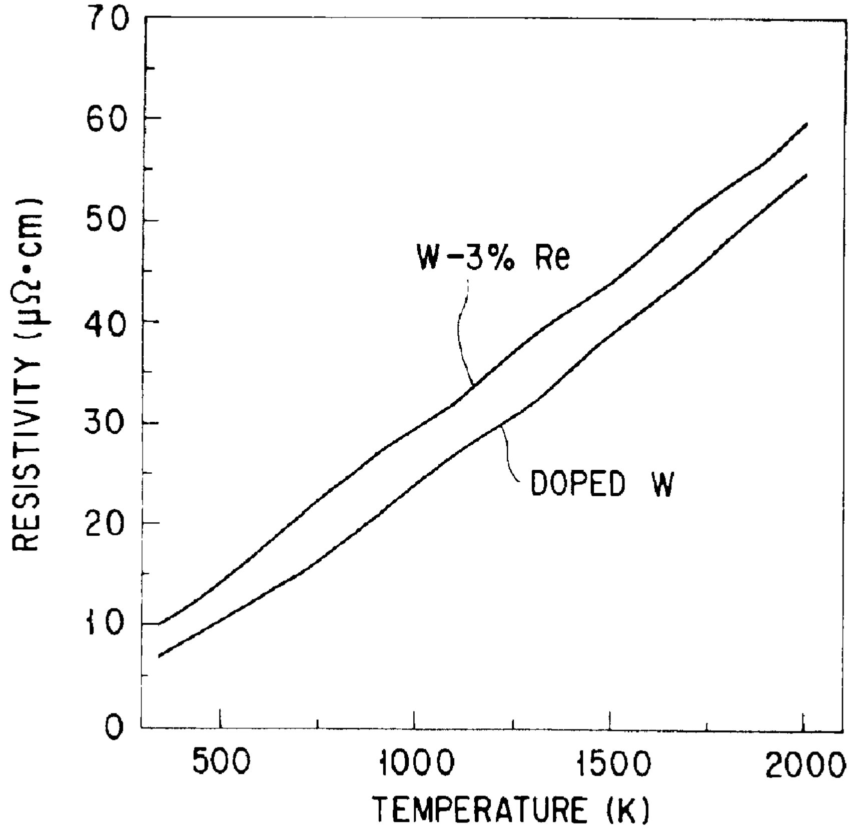
FIG. 9 is a graph showing the relationship between the electric resistivity and the temperature variation in relation to doped tungsten and 3%-Re containing tungsten.

FIG. 9 shows the electric resistivity (represented by a vertical axis) and the temperature variation in relation to doped tungsten and 3%-Re containing tungsten. It can be understood that tungsten containing 3% of Re has higher resistivity in a wider temperature range than the conventional doped tungsten. The data has been obtained by measuring the filament surface temperature and the electric resistivity when the current flows to each of the filaments having the above compositions.

It can be understood from the data that in a case where tungsten contains Re, if the same amount of the current flows to the filament, the filament's temperature will rise as the resistivity is higher. When the filament's temperature rises, the temperature inside the arc chamber 21 also rises, the momentum of the gas molecules is increased, the possibility of collision with the thermoelectrons discharged from the filament is increased, the efficiency in the ionization is increased and the ion beam is converted into high current.

In addition, as the electric resistivity is high, the diameter of the filament can be made larger than the conventional doped tungsten filament to obtain a predetermined resistance value (i.e. the resistance value of the conventional doped tungsten). The high resistivity is also effective for increase in the strength of the filament, and the life of the filament can be made longer.

Re is contained in tungsten in the above explanation, but the present invention is not limited to this. Even if any one of Co, Ce, Nd, Sm, Eu, Gd, Er, Yb, Lu, Sc, Y and La is contained, the same advantage can be obtained.

(Third Embodiment)

Next, a third embodiment of the present invention will be explained.

In the third embodiment, the structure of the ion generation apparatus is the same as that of the second embodiment, and its explanation is omitted. The present embodiment is characterized by using a product formed by processing tungsten containing 2% of $La_2O_3$, which is a rare earth oxide, in place of Re that is used in the second embodiment, as a tungsten member used for the arc chamber.

In the ion generation apparatus according to the third embodiment, the tungsten filament 124 containing 2% of $La_2O_3$ is provided via the insulation support members 122, and via the reflectors (spacers) 123 constituted by tungsten containing 2% of $La_2O_3$, on one side surface of the arc chamber 121 formed by processing tungsten containing 2% of $La_2O_3$, as shown in FIGS. 5A and 5B.

The counter electrode 125 constituted by tungsten containing 2% of $La_2O_3$ is provided via the insulation support member 122, on the other side surface of the arc chamber 121. $BF_3$ gas is, for example, supplied through the gas inlet opening 126, and the ions are extracted through the ion extraction opening 128 provided on the front plate. That is, all the tungsten members contain 2% of $La_2O_3$ in place of Re used in the second embodiment.

In the third embodiment, tungsten containing 2% of $La_2O_3$ is also used for the front plate comprising the ion extraction opening 128. When $BF_3$ gas is supplied through the gas inlet opening 126 and the thermoelectrons are discharged from the filament 124, $BF_3$ gas is ionized by the discharging.

The generated B ions, F ions, $BF_2$ ions and the like are extracted through extraction opening 128. After that, only B ions are extracted by the analyzing magnet and irradiated onto the sample. In this case, about 4 mA of beam current is obtained with the acceleration voltage at 5 keV. Stable discharging can be obtained at the beam regulation of about ±5%, regardless of the length of the discharging time, up to sixty hours, and the discharging can be kept for up to about eighty hours.

On the other hand, when $BF_3$ gas is introduced into the conventional ion source chamber using the doped tungsten to execute the ionization, 3.5 mA of the beam current can be obtained, but the amount of the beam current is inclined to be reduced as the discharging time goes by. After the discharging has executed ten hours, the amount of the beam current is reduced to 2.8 mA, i.e. about 20% of the beam current is reduced, and the discharging becomes unstable in about fifty hours, and therefore, the ionization becomes difficult.

Thus, it can be understood that the tungsten filament containing 2% of $La_2O_3$ has higher stability in the amount of the ion beam current than the conventional doped tungsten containing a trace amount of Al, Si and K. This indicates the difference in the amount of the thermoelectrons discharged from the filament.

The filament of the doped tungsten containing a trace amount of Al, Si and K is set to have the diameter of 2.2 mm and the filament containing 2% of $La_2O_3$ is set to have the diameter of 2.5 mm so that they have a predetermined electric resistivity, i.e. 26 (mΩ·cm). Therefore, the filament containing 2% of $La_2O_3$ has a larger diameter to obtain a predetermined resistance value, i.e. to supply the same amount of thermoelectrons, and its strength can be thereby made larger. For this reason, exhaustion of the filament caused by the etching, which occurs together with the collision with the ions caused by the long-time discharging, can be restricted and stable ion discharging can be executed for a long time.

Further, when $La_2O_3$, which is a rare earth oxide, is added, the surface area of the filament can be made larger, and much more thermoelectrons can be discharged. Therefore, efficiency of ionization is improved and, consequently, the amount of ion beam current can be increased.

Thus, the lowering of the amount of the ion beam current to the low acceleration energy of the ion beam can be also restricted. That is, if the ionized ions are extracted at low voltage, the beam cannot be focused (i.e. the beam is extended). Therefore, the focal point is moved and, consequently, the amount of the ion irradiated onto the processed substrate is reduced. However, the discharged thermoelectrons can be increased by making the surface area of the filament large. Therefore, the efficiency in the ionization can be improved, the ions irradiated onto the processed substrate can be increased rather than a case of using the filament containing conventionally used pure tungsten or a trace amount of Al, Si and K, and the lowering of the throughput can be restricted.

Crystal grains of tungsten disappear in the heat treatment due to its characteristics, and therefore, tungsten loses its toughness and increases the embrittlement. When the strength of tungsten is considered in terms of the variation in the tensile strength, pure tungsten and doped tungsten containing a trace amount of Al, Si and K have the tensile strengths of about 2300 $kg/cm^2$ at 1200° C. (five minutes), about 1400 $kg/cm^2$ at 2300° C. (five minutes), and about 1000 $kg/cm^2$ at 2700° C. (five minutes). On the other hand, tungsten containing 2% of $La_2O_3$, which is a rare earth oxide, has the tensile strengths of about 2700 $kg/cm^2$ at 1200° C. (five minutes), about 1600 $kg/cm^2$ at 2300° C. (five minutes), and about 1400 $kg/cm^2$ at 2700° C. (five minutes). It can be understood that as the temperature is higher, the tensile strength of tungsten containing 2% of $La_2O_3$ is larger than that of pure tungsten and doped tungsten containing a trace amount of Al, Si and K. This therefore teaches that tungsten containing 2% of $La_2O_3$ is superior in the strength at a higher temperature, and can be stably used without being influenced by the precipitation of the additives caused by the recrystallization.

In the above-described third embodiment, the tungsten filament has been explained by using $La_2O_3$ (lanthanum oxide) as the additive, but the other rare earth oxides such as $Y_2O_3$ (yttrium oxide) and $CeO_2$ (cerium oxide) can be used. Further, at least one of oxides of Co, Nd, Sm, Eu, Gd, Tb, Er, Yb, Lu and Sc can be also used. Moreover, the additives explained in the second embodiment can be also used together.

In the second and third embodiments, $BF_3$ has been used as the discharging gas, but other gasses can be used.

Further, in the second and third embodiments, Re or $La_2O_3$ is added, as impurities, in the reflectors, the counter electrode, front plate, the ion source chamber (arc chamber) as well as the filament. However, even if it is added only to the filament, almost the same advantage can be obtained. If Re or $La_2O_3$ is added to the filament, through the use of the conventional arc chamber the present invention's advantage can be easily achieved. If the impurity is added to the reflector and the counter electrode as well as the filament, the advantage can be further increased.

Moreover, the application to the Bernas-type ion source has been explained, but the present invention can be applied to the other systems.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of generating ions, comprising:

heating an ion source material composed of indium iodide (InI) and having a particle size larger than 1 mm and not larger than 5 mm to generate a vapor of said indium iodide (InI); and generating indium (In) ions by discharging said vapor.

2. The method according to claim 1, wherein said heating an ion source material comprises heating said indium iodide (InI) at a temperature of not lower than 275° C. and not higher than 380° C. to generate said vapor of said indium iodide (InI).

3. The method according to claim 1, wherein said heating an ion source material includes supplying said indium iodide into an oven which has an outlet nozzle for said vapor, followed by heating said indium iodide whose particle size is larger than a diameter of said outlet nozzle.

4. The method according to claim 1, wherein, in said step of generating indium (In) ions by discharging said vapor, a support gas inlet to an arc chamber and a vapor inlet to said arc chamber are provided on one face of said arc chamber, and are configured to introduce support gas and said vapor into said arc chamber.

5. A method of irradiating ions, comprising:

heating an ion source material composed of indium iodide (InI) and having a particle size larger than 1 mm and not larger than 5 mm to generate a vapor of said indium iodide (InI);

generating indium (In) ions by discharging said vapor; and selectively irradiating said indium (In) ions onto a substrate to be processed.

6. The method according to claim 5, wherein said heating an ion source material includes supplying said indium iodide into an oven which has an outlet nozzle for said vapor, followed by heating said indium iodide whose particle size is larger than a diameter of said outlet nozzle.

7. A method of generating ions, comprising:

heating an ion source material composed of indium iodide (InI) which is supplied in an oven having a vapor outlet nozzle and whose particle size is larger than a diameter of said outlet nozzle; and generating indium (In) ions by discharging said vapor.

8. The method according to claim 7, wherein said heating an ion source material includes heating said indium iodide at a temperature of not lower than 275° C. and not higher than 380° C.

9. The method according to claim 7, wherein, in said step of generating indium (In) ions by discharging said vapor, a support gas inlet to an arc chamber and a vapor inlet to said arc chamber are provided on one face of said arc chamber, and are configured to introduce support gas and said vapor generated into said arc chamber.

10. A method of irradiating ions, comprising:

heating an ion source material to generate vapor thereof, the ion source material being composed of indium iodide (InI) which is supplied in an oven having a vapor outlet nozzle and whose particle size is larger than a diameter of said outlet nozzle;

generating indium (In) ions by discharging said vapor; and selectively irradiating said indium (In) ions onto a substrate to be processed.

11. The method according to claim 10, wherein the ion source material composed of indium iodide has a particle size larger than 1 mm and not larger than 5 mm.

* * * * *